United States Patent [19]
Van Lieverloo

[11] Patent Number: 5,483,177
[45] Date of Patent: Jan. 9, 1996

[54] INTEGRATED CIRCUIT HAVING A NOISE-REDUCING OUTPUT STAGE WITH MUTUALLY-DELAYED ACTIVATION CIRCUIT

[75] Inventor: Henricus A. L. Van Lieverloo, Nijmegen, Netherlands

[73] Assignee: U.S. Philips Corporation, New York, N.Y.

[21] Appl. No.: 263,114

[22] Filed: Jun. 21, 1994

[30]     Foreign Application Priority Data

Jun. 22, 1993 [EP] European Pat. Off. ............ 93201794

[51] Int. Cl.⁶ .......................................... H03K 17/284
[52] U.S. Cl. .................. 326/27; 326/29; 327/269
[58] Field of Search ................. 326/27–29; 327/269

[56]            References Cited

U.S. PATENT DOCUMENTS

| | | | |
|---|---|---|---|
| 4,783,601 | 11/1988 | Hartgring et al. | 307/246 |
| 4,789,796 | 12/1988 | Foss | 307/443 |
| 4,959,561 | 9/1990 | McDermott et al. | 326/27 |
| 5,013,940 | 5/1991 | Ansel | 326/27 |
| 5,124,579 | 6/1992 | Naghshineh | 326/27 |
| 5,216,293 | 6/1993 | Sei et al. | 326/27 |
| 5,220,208 | 6/1993 | Schenck | 326/27 |
| 5,231,311 | 7/1993 | Ferry et al. | 326/27 |

*Primary Examiner*—David R. Hudspeth
*Attorney, Agent, or Firm*—Steven R. Biren

[57]            ABSTRACT

The invention relates to an integrated circuit, having an output stage with at least two respective output transistors, respective main current channels of which are connected in parallel between a first supply terminal and the output. A control circuit ensures that, in response to a variation in an input signal on the input, the charging of respective control electrodes of the at least two respective output transistors commences with a delay relative to one another. The peak value of the time derivative of a current output together by the at least two output transistors is thus limited. After the start of charging, a speed of charging of the control electrode of at least one of the two respective output transistors is reduced. The peak value of the time derivative of the current applied to the output by the at least one of the at least two output transistors is thus reduced.

10 Claims, 3 Drawing Sheets

INTEGRATED CIRCUIT HAVING A NOISE-REDUCING OUTPUT STAGE WITH MUTUALLY-DELAYED ACTIVATION CIRCUIT

BACKGROUND OF THE INVENTION

The invention relates to an integrated circuit, comprising an output stage which is organized as a series of at least two output transistors whose main current channels are connected parallel to one another between a supply terminal and an output of the output stage, a control circuit which is arranged to start, in response to a variation in an input signal on an input, a charging of respective control electrodes of the output transistors in a mutually delayed fashion in the order of the series.

An integrated circuit of this kind is known from U.S. Pat. No. 4,789,796.

During use of such an integrated circuit, the output is usually capacitively loaded. When the output voltage of the circuit changes from high to low, therefore, a capacitance must be discharged. Discharging is realized by way of a current through the output via the main current channels of the output transistors to the supply leads of the circuit. The supply leads act as an inductance, so that a variation in the current causes an inductive voltage across the supply leads which is proportional to the time derivative of the current.

Due to the inductive voltage across the supply leads, the power supply terminals, such as ground outside the envelope of the integrated circuit and ground within the integrated circuit, no longer carry the same potential. This disturbs the operation of the circuit.

This disturbance is reduced by the known circuit, in that the peak value of the time derivative of the current is reduced, subject to the secondary condition that the capacitance must have been discharged within a specified period of time. Mutually delayed starting of the charging of the control electrodes ensures that the control electrodes of the output transistors do not reach their maximum voltage level simultaneously. Therefore, the instant at which the increase of the current through the various output transistors is maximum differs. As a result, the peak value of the time derivative of the current through the output is smaller than if the current in the at least two output transistors were to increase simultaneously.

As the number of output transistors is larger, in principle an increasingly lower peak value can thus be realized in the derivative of the current. However, this requires a complex circuit in which notably the wiring occupies a large surface area on the integrated circuit.

U.S. Pat. No. 4,783,601 discloses another output stage. This output stage consists of one output transistor whose main current channel is connected between a first supply terminal and the output.

To this end, the output stage comprises a control circuit which is arranged for charging the control electrode of the output transistor in response to a variation in an input signal on the input. The control circuit comprises several charging current branches, all but one of which are switched off when the voltage on the control electrode exceeds a threshold value. Thus, at the beginning of charging the charging current of the control electrode is larger than that at the end of charging.

By making the charging current larger at the beginning, the time required for reaching the maximum current through the output is reduced, without increasing the peak value of the derivative of the current. The charging time required can be further reduced by connecting more charging current branches in parallel and by switching off these branches at different threshold values.

The peak value of the time derivative of the current of the output stage published in U.S. Pat. No. 4,783,601, however, is very sensitive to a spread in the parameters of the integrated circuit. Moreover, the output stage does not operate very well in the case of low supply voltages, because it is difficult to realize sufficiently accurate adjustment of the threshold value of the voltage on the control electrode at which the various charging current branches must be switched off. Furthermore, this circuit cannot be optimally used for different supply voltages, because the switching off of the branches is dependent on the supply voltage.

SUMMARY OF THE INVENTION

It is inter alia an object of the invention to provide an integrated circuit comprising an output stage in which the peak value of the time derivative of the output current is reduced further, without unnecessarily reducing the time required to reach the maximum current.

The integrated circuit in accordance with the invention is characterized in that the control circuit comprises switching means for switching back from a speed of charging for a first one of the output transistors, between the starting of charging of the first output transistor and the starting of a second output transistor which directly succeeds the first output transistor in the series, in order to make a maximum time derivative of a current through the output, reached between the starting of the first and the second output transistors, smaller than it would have been without said switching back. Thus, the time derivative of the current through the output between the starting of the first and the second transistor is smoothed. Switching back takes place at an instant at which the voltage on the control electrode is already comparatively high, i.e. in the region in which the current through the output transistor responds more strongly to voltage variations than in the presence of a low voltage. Switching back prevents the current as a function of the time from increasing also more strongly in this region.

It has been found that an integrated circuit thus constructed is less sensitive to a spread in the parameters of the integrated circuit. This is because the effect of the parameters is distributed between the currents through the various output transistors, so that it has less effect on the highest peak value of the currents.

An embodiment of the integrated circuit in accordance with the invention is characterized in that the control circuit comprises at least two current branches between a further supply terminal and the control electrode of the first output transistor, which branches are coupled parallel to one another, the control circuit being arranged for activating the at least two current branches simultaneously upon starting of the charging for the first output transistor, and to deactivate a sub-set of the current branches upon switching back. Switching back of the charging current can thus be simply realized.

A further embodiment of the integrated circuit in accordance with the invention is characterized in that the input of the control circuit is coupled to an input of delay means, taps of the delay means being coupled to the current branches for the purpose of control to activate the current branches simultaneously and to deactivate said sub-set of the current branches after a delay time. Consequently, deactivation need not take place in response to the voltage on the control electrode of the output transistor. The control circuit can thus operate with a variety of supply voltages. Furthermore, the use of feedback circuits which would render the output stage unnecessarily slow is thus avoided.

An embodiment of the integrated circuit in accordance with the invention is characterized in that a first one of the current branches comprises a main current channel of a first charging transistor, and that a second one of the current branches comprises a series connection of the main current channels of a second and a third charging transistor, a first one of the taps being coupled to respective control electrodes of the first and the second charging transistor in order to activate the current branches, a second one of the taps being coupled to a control electrode of the third charging transistor in order to deactivate the second current branch after the delay time. The time-dependent charging current can thus be readily realized.

An embodiment of the integrated circuit in accordance with the invention is characterized in that the output is retrocoupled to a control input of at least one of the current branches coupled to the control electrode of at least one of the output transistors for which the charging of its control electrode is started as the last one in the series in order to deactivate this current branch when a voltage difference between the output and the supply terminal is less than a predetermined threshold value. It has been found that current through the output transistor which is started first responds strongest to variations of the voltage on the control electrode. In order to prevent the peak value of the derivative of the current through the output transistor started first from being higher than that of the current through the further output transistors for this reason, the transistor started first is proportioned so as to be smaller so that, in comparison with the further output transistors, it draws less current in the presence of a given voltage on the control electrode.

An embodiment of the integrated circuit in accordance with the invention is characterized in that a W/L ratio of one of the output transistors, for which the charging of its control electrode is started first, is smaller than the W/L ratio of a further output transistor for which the charging of its control electrode is started later. The peak value of the derivative of the current of the last output transistor is thus further suppressed when the voltage on the output has already decreased sufficiently.

BRIEF DESCRIPTION OF THE DRAWING

The invention and its advantages will be described in detail hereinafter with reference to the Figures, in which.

DESCRIPTION OF THE PREFERRED EMBODIMENTS

Figure 1:
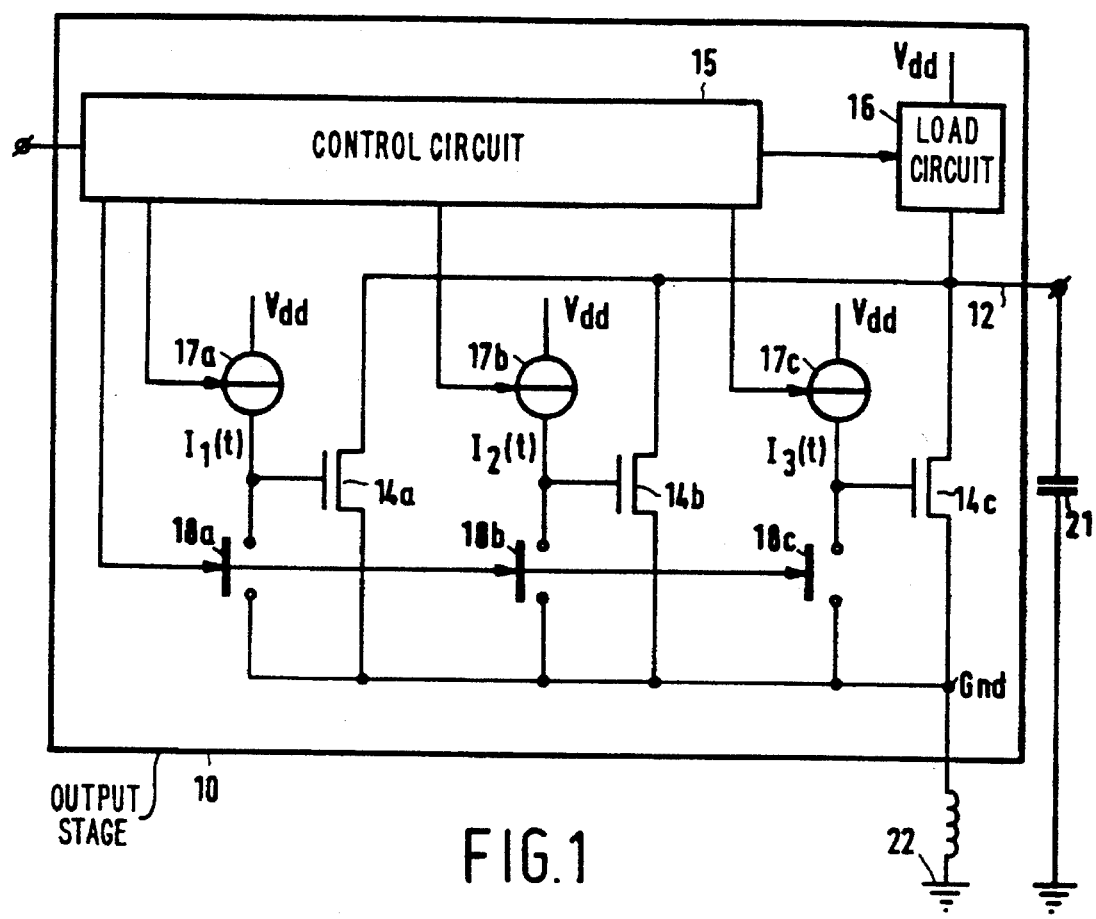
FIG. 1 shows an output stage for an integrated circuit in accordance with the invention.

FIG. 1 shows an output stage 10 for an integrated circuit in accordance with the invention. The output stage 10 comprises two supply terminals ($V_{dd}$ and $G_{nd}$), an input and an output 12. Between the output 12 and a first one of the supply terminals ($G_{nd}$) there is provided a pull-down circuit. The output 12 is also coupled, via a load circuit 16 (not shown in detail for the sake of clarity) which serves as a pull-up circuit, to the second supply terminal $V_{dd}$.

The pull-down circuit comprises three NMOS output transistors 14$a,b,c$, the main current channels of which are coupled between the output 12 and the first supply terminal $G_{nd}$. The number of three NMOS output transistors 14$a,b,c$ is chosen as a practical example; the invention is by no means restricted to this number, it alternatively being possible to use two, four or more output transistors. In the pull-down circuit the input is coupled to a circuit 15 which is coupled to three charging circuits 17$a,b,c$ for the purpose of control. The charging circuits 17$a,b,c$, being shown as current sources connected to the supply terminal $V_{dd}$ on one side, are coupled to respective gates of the NMOS output transistors 14$a,b,c$. Moreover, the gates of the NMOS output transistors 14$a,b,c$ are coupled to the first power supply terminal $G_{nd}$ via a respective switch 18$a,b,c$.

When the input signal of the circuit is such that the voltage on the output 12 must be logic high, the switches 18$a,b,c$ are conductive and the charging circuits 17$a,b,c$ are inactive. The voltage on the gates of the output transistors 14$a,b,c$ is then substantially equal to the potential of the first supply terminal $G_{nd}$ and the output transistors 14$a,b,c$ are not turned on. The pull-up circuit 16 then pulls the potential on the output 12 to that of the second supply terminal $V_{dd}$.

When the voltage on the output 12 must be logic low, the pull-up circuit 16 is inactive, the switches 18$a,b,c$ are rendered non-conductive, and the current sources 17$a,b,c$ are connected. The voltage on the gates of the output transistors 14$a,b,c$ in the steady state is then substantially equal to the potential of the second supply terminal $V_{dd}$ and the output transistors 14$a,b,c$ are turned on. The output transistors 14$a,b,c$ then pull the potential of the output 12 to that of the first supply terminal $G_{nd}$.

The output stage 10 is provided on a semiconductor chip which comprises bond pads for connection to an external power supply (not shown).

During use current is applied from the power supply to the chip via bonding wires. The bonding wires behave electrically as a self-inductance. The self-inductance is symbolically represented by a coil L which is connected between the first power supply $G_{nd}$ and the external power supply terminal 22. The other power supply terminal $V_{dd}$ of the chip will also comprise a self-inductance; however, because this self-inductance is not necessary for the explanation, it is not shown in the Figure. The output 12 of the output stage is loaded by other circuits during use. These other circuits constitute a load which contains a strong capacitive component which is symbolically represented by a load capacitor 21 in the Figure.

Upon switching over from logic high ($V_{dd}$) to logic low ($G_{nd}$) on the output 12, the circuit should discharge the capacitor. To this end, a current is applied from the output 12 to the first supply terminal $G_{nd}$. This current also passes through the self-inductance L. Across this self-inductance an inductive voltage difference $V_I$ develops which is proportional to the time derivative dI/dt of the current I through the output stage 10:

$V_I = L\ dI/dt.$

This application causes a variation of the current through the self-inductance L and hence an inductive voltage difference $V_I$ between the internal supply terminal $G_{nd}$ and the external supply terminal 22. This inductive voltage difference has a disturbing effect on the operation of the integrated circuit and the invention aims to minimize this effect.

Figure 2:
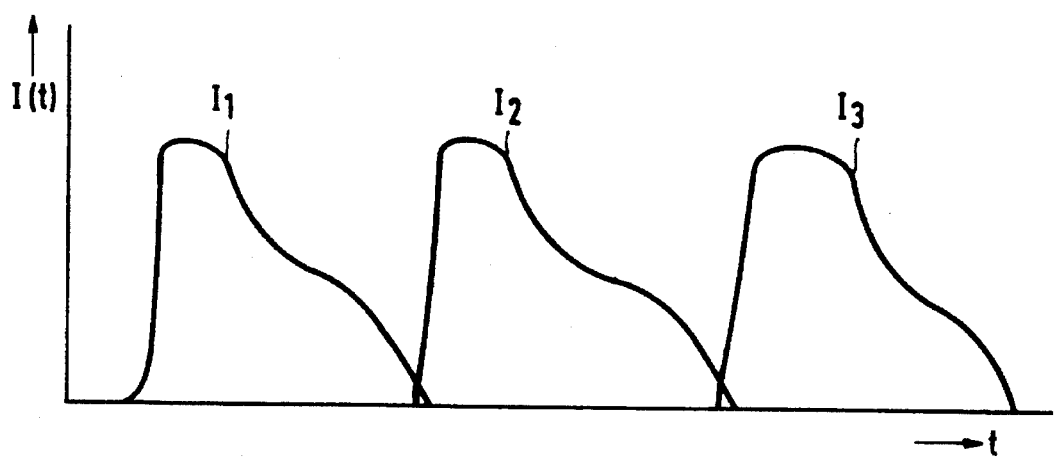
FIG. 2 shows the time dependency of the charging currents in the output stage shown in FIG. 1.

The current sources 17a,b,c serve to limit the inductive voltage difference. Under the control of respective control signals, the current sources 17a,b,c provide time-dependent currents $I_1(t)$, $I_2(t)$ and $I_3(t)$ when the output 12 is to be switched from logic high to logic low after a change of the signal on the input. FIG. 2 shows the time-dependency of the currents $I_1(t)$, $I_2(t)$ and $I_3(t)$ through the current sources 17a,b,c. The various current sources 17a,b,c are switched in a delayed fashion relative to one another. The currents $I_1(t)$, $I_2(t)$, $I_3(t)$ are all large at the beginning and are subsequently reduced.

Due to the supply of the current $I_1(t)$, the voltage on the gate of, for example the NMOS output transistor 14a will rise rapidly at the beginning and subsequently in a slower fashion until a steady state level is reached. Because the currents $I_1(t)$, $I_2(t)$ and $I_3(t)$ start to flow with a delay relative to one another, the various NMOS output transistors 17a,b,c will start to conduct at different instants. The time derivative of the current through the self-inductance L, therefore, is smaller than it would be if all output transistors 14a,b,c were turned on simultaneously.

Under the control of the rise of the voltage on the gate of, for example the NMOS output transistor 14a, this output transistor will start to draw an increasing current through its main current channel. If the voltage on the gate of the NMOS output transistor 14a were to increase linearly in time, the current through the main current channel would thus increase faster than linearly (the relationship between the gate voltage and the main current of the output transistor 14a is not linear). The current $I_1(t)$, however, decreases as a function of time, so that the voltage on the gate of the output transistor 14a increases less rapidly, so that the increase of the derivative due to the non-linear relationship between the gate voltage and the main current is counteracted.

A similar time-dependency holds for the further output transistors 14b,c. The voltage of the output 12 still has its maximum value when the output transistor 14a is turned on, i.e. transistor which is the first one to be turned on. The current through the first output transistor 14a, therefore, reacts more quickly to variations of its gate voltage. In order to prevent the derivative of the current from becoming much larger than the derivatives of the current through the further output transistors, the W/L ratio of the first output transistor is preferably smaller than that of the further output transistors. This effect is most pronounced for the first output transistor 14a, being turned on first, but also exists for the further output transistors. Therefore, the W/L ratio of the output transistors 14a,b,c is preferably greater as they are turned on later. An example of a suitable ratio of the W/L ratios of respective output transistors 14a,b,c is: 1:2:3. The absolute value of the W/L ratios is determined by the DC specification of the integrated circuit, prescribing a maximum DC voltage drop across the output transistors for a given DC output current.

The time-dependency of the currents $I_1(t)$, $I_2(t)$, $I_3(t)$ in practice is chosen to be dependent on the properties of the output transistors 14a,b,c and the type of current source 17a,b,c. The embodiment shown is given merely by way of example.

Figure 3:
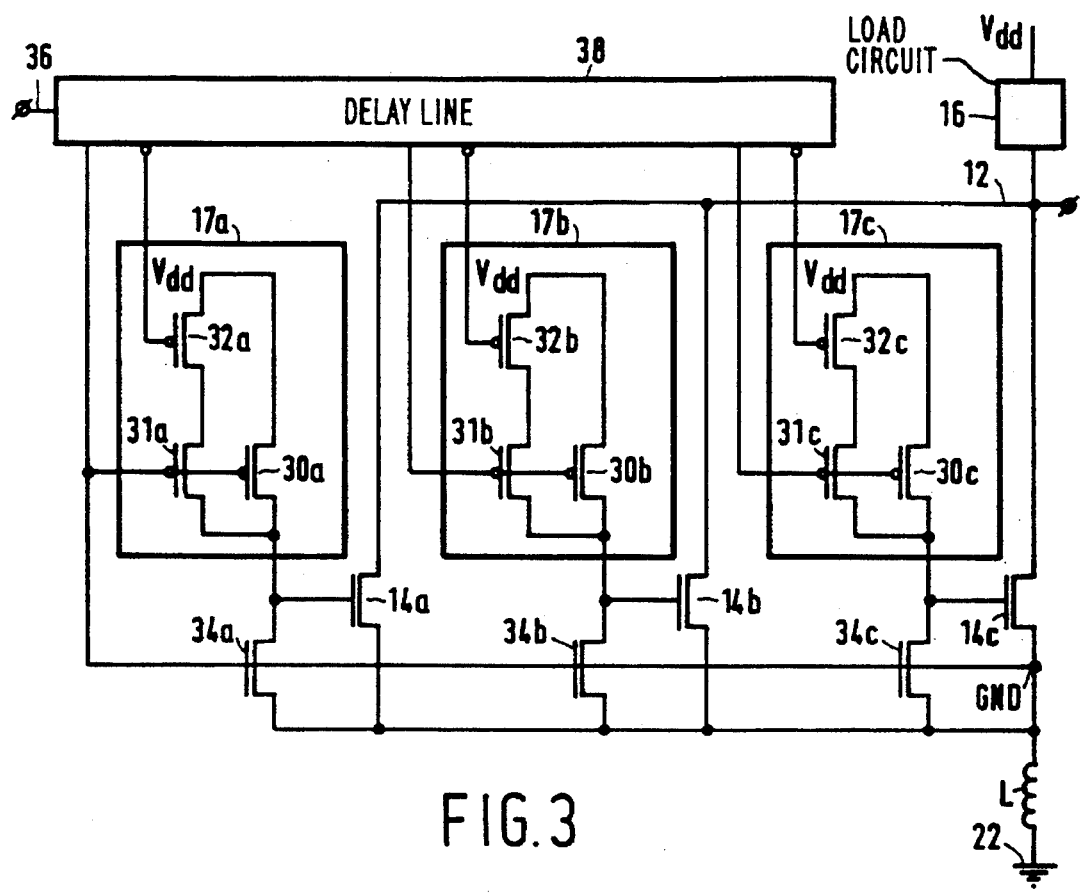
FIG. 3 shows an embodiment of the output stage.

FIG. 3 shows an embodiment of the output stage for an integrated circuit. Therein, the components already shown in FIG. 1 are denoted by the same references as used in FIG. 1. Each of the charging circuits 17a,b,c is constructed as a parallel connection of a first and a second branch. This parallel connection is coupled between the second power supply $V_{dd}$ and the gate of the output transistor 14a,b,c. The first branch comprises the main current channel of a PMOS transistor 30a,b,c. The second branch comprises a series connection of the main current channels of two PMOS transistors 31a,b,c and 32a,b,c. The switches 18a,b,c (FIG. 1) are realized as NMOS transistors 34a,b,c.

The input 36 of the output stage is coupled to the input of a delay line 38. Outputs of the delay line 38 are coupled to the gates of the transistors 30a,b,c, 31a,b,c and 32a,b,c in the charging circuits 17a,b,c. Furthermore, an output of the delay line is coupled to the gates of the NMOS transistors 34a,b,c which serve as switches. The distance between the input of the delay line 38 and the various outputs symbolizes the delay between the signal on the input and the various outputs, a dot on an output indicates that the output supplies an inverted signal.

The operation of the circuit will be explained for the case where a signal undergoing a transition from logic high to logic low is presented to the input 36. First the gates of the transistors 34a,b,c receive a low voltage so that they are turned off and one of the charging circuits (17a) is activated. In response to the activation, first both branches (30a and 31a, 32a) of the charging circuit 17a are turned on. After a delay time, the second branch (31a, 32a) is turned off because one of the two transistors 32a in this branch is turned off under the control of an inverted, delayed version of the input signal. The gate of the output transistor 14a is thus charged initially by both branches (30a and 31a, 32a) and subsequently by only the first branch 30a (and hence in a slower fashion). The switching point is chosen so that the maximum derivative of the current through the output transistor 14a is reduced thereby. Except for a delay, the further charging circuits 17b,c operate in the same way as the first charging circuit 17a.

The sequence of switching on and off of the various branches 30a,b,c, 31a,b,c and 32a,b,c corresponds to the sequence in which the taps on the delay line are shown. The optimum choice of the delay between the various switching instants is dependent on the transistors used and is determined preferably by simulation. The peak value of the resultant time derivative is then determined and a combination of delay times which minimizes this peak value is chosen.

The second branch (31a, 32a) need not be switched off by means of a delayed input signal. Alternatively, the second branch 31a, 32a can be controlled by the voltage on the gate of the output transistor 14a. For example, the gate of the transistor 32b whereby the second branch is switched off can be connected to the gate of the output transistor 14a. The current through the second branch 31a, 32a will then decrease as the voltage on the gate of the output transistor 14a increases and will be switched off completely when this voltage equals the second supply voltage $V_{dd}$ minus a threshold voltage $V_T$.

Such a decrease of the current through the second branch 31a, 32b ensures a reduction of the maximum derivative of the current through the output. However, if the second supply voltage $V_{dd}$ is not known in advance, for example because the user of the integrated circuit is free to use different supply voltages, it is difficult to control the maximum derivative of the output current in this manner. Moreover, this causes a dependency on the possibilities offered by the parameters of the transistors (for example, the value of $V_T$); this hampers suitable control notably in the case of a low supply voltage $V_{dd}$.

Even when only one output transistor (for example, only 14a in conjunction with the charging circuit 17a, so without 14b,c and 17b,c) is used, the charging circuit with a delay line can be controlled better in this case.

The number of two parallel-connected branches (30a,b,c and 31a,b,c, 32a,b,c) is given merely by way of example. A parallel connection of more than two branches can also be provided for the charging of the gate of one or more of the output transistors 14a,b,c. Each of these branches comprises, for example a series connection of the main current channels of two transistors. The gate of one of these transistors is controlled, together with the gates of transistors 30a,b,c, 31a,b,c, in the other branches in the same charging circuit, so as to activate the charging circuit 17a,b,c. Another transistor in each branch is controlled, with a delay with respect to the transistor 32a,b,c and in inverted form, so as to deactivate the branches. As the time after activation of the charging circuit 17a,b,c elapses, an increasing number of branches is deactivated. The time-dependency of the current can thus be more accurately adjusted. It has been found in practice that the use of two branches as shown in FIG. 3 suffices.

When a signal undergoing a transition from logic low to logic high is presented to the input 36, the charging circuits 17a,b,c are switched off and the transistors 34a,b,c are turned on. Preferably, the charging circuits 17a,b,c are not active when the transistors 34a,b,c are turned on. In order to achieve this, the delay between the arrival of the low-to-high transition and the deactivation of the charging circuit 17a,b,c is preferably shorter than the delay between the arrival of the high-to-low transition and the activation of the charging circuit 17a,b,c.

Figure 4:
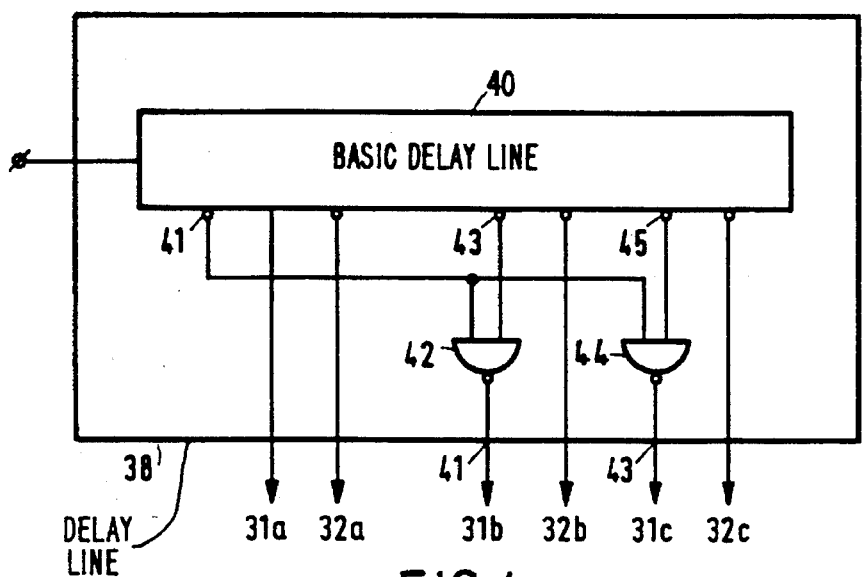
FIG. 4 shows an embodiment of a delay line.

FIG. 4 shows an embodiment of a delay line 38 serving this purpose. The delay line 38 comprises a basic delay line 40 with a number of taps. Each of the taps 43, 45 used to deactivate the charging circuits 17b,c, is coupled, in inverted form via a NAND-gate 42, 44, to the gates of the transistors 30b,c, 31b,c in the charging circuits 17b,c. The NAND-gate also comprises an input which is coupled to a leading, inverted tap 41 of the basic delay line 40.

Because activation takes place via a NAND-gate, one of the input signals of which is tapped from the basic delay line 46 with a short delay, deactivation of the charging circuits will be faster than activation. Evidently, instead of a NAND-gate operating with inverted versions of the input signal, any other logic function having the same effect can be used.

The delay line 38 preferably comprises a cascade of inverters integrated together with the output stage, the input of the cascade constituting the input of the delay line 38. The outputs of the delay chain 38 are tapped on the outputs of the inverters in the cascade. The proportioning of the inverters in the cascade determines the delay times and is chosen so that the peak value of the output current of the output stage is minimized.

The delay times realized by the cascade are codependent on fluctuations in the operating conditions (supply voltage $V_{dd}$, temperature and the like). The speed of charging of the gates of the output transistors 14a,b,c is also dependent on these fluctuations. Because the delay times and the charging speed change together, the time relationship between the currents $I_1(t)$, $I_2(t)$ and $I_3(t)$ and their own time-dependency is maintained despite these fluctuations.

The pull-up circuit 16 can be constructed in the same way as the pull-down circuit shown in the FIGS. 1 and 3. The PMOS transistors in the pull-down circuit are replaced by NMOS transistors in the pull-up circuit 16 and vice versa; $V_{dd}$ and $G_{nd}$ are interchanged in the pull-up circuit 16; The delay line comprises NOR-gates instead of NAND-gates for activating and deactivating the charging circuits of the pull-up circuit.

Because, generally speaking, the noise margin for $V_{dd}$ is wider than that for $G_{nd}$, the pull-up circuit 16 usually does not require as many output transistors as the pull-down circuit.

Figure 5:
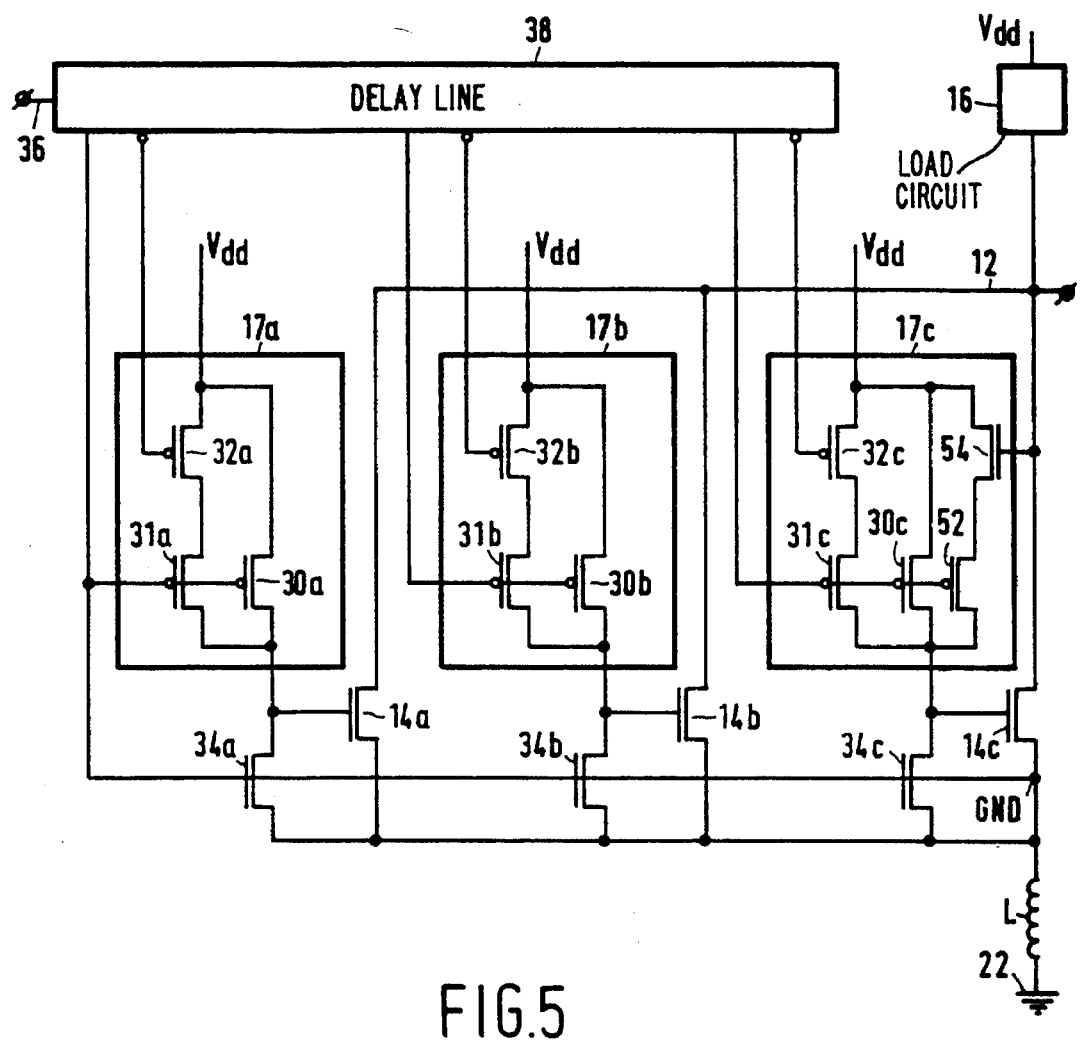
FIG. 5 shows a further embodiment of the output stage.

FIG. 5 shows a further embodiment of the output stage in accordance with the invention. It highly resembles the embodiment shown in FIG. 3. The difference consists in that the charging circuit 17c for the gate of the output transistor 14c, being activated last, comprises an additional branch which extends parallel to the previously mentioned first and second branches (30c and 31c, 32c). The additional branch comprises a series connection of the main current channels of a PMOS transistor 52 and an NMOS transistor 54. The gate of the PMOS transistor 52 is coupled to the gates of the transistors 30c, 31c whereby the other branches of the charging circuit 17c are activated. The gate of the NMOS transistor 54 is coupled to the output of the output stage.

During operation the NMOS transistor 54 will deactivate the additional branch when the output voltage is sufficiently low. The time derivative of the current through the output transistor 14c then becomes lower if the output voltage is already sufficiently low. This may be the case, for example when the capacitive load of the output 12 is comparatively small so that it can already be quickly discharged for the better part by the first and the second activated output transistor 14a,b. The additional branch in the charging circuit, therefore, is used only in the case of a high load. This type of retrocoupling is useful notably for the last output transistor 14c, but can also be used in the other transistors 14a,b. The DC supply capacity of the output stage is not influenced by the retrocoupling.

I claim:

1. An integrated circuit, comprising:

an output stage which is organized in as series of at least two output transistors whose main current channels are connected parallel to one another between a supply terminal and an output of the output stage; and a control circuit which is arranged to start, in response to a variation in an input signal on an input, a charging of respective control electrodes of the output transistors in a mutually delayed fashion in the order of the series;

characterized in that the control circuit comprises switching means for reducing a charging rate for a first one of the output transistors between the starting of the charging of the first output transistor and the starting of a second output transistor which directly succeeds the first output transistor in the series, in order to make a maximum time derivative of a current through the output, reached between the starting of the first and the second output transistors, smaller than it would have been without said switching back.

2. An integrated circuit as claimed in claim 1, characterized in that the switching means are arranged for reducing, between the starting of the charging for two successive output transistors, the charging rate of an already started one of said two output transistors.

3. An integrated circuit as claimed in claim 1, characterized in that the control circuit comprises at least two current branches between a further supply terminal and the control electrode of the first output transistor, which branches are coupled parallel to one another, the control circuit being ganged for activating the at least two current branches simultaneously upon starting of the charging for the first output transistor, and to deactivate a sub-set of the current branches upon switching back.

4. An integrated circuit as claimed in claim 3, characterized in that the input of the control circuit is coupled to an input of delay means, taps of the delay means being coupled to the current branches for the purpose of control to activate the current branches simultaneously and to deactivate said sub-set of the current branches after a delay time.

5. An integrated circuit as claimed in claim 4, characterized in that delay means comprise a further tap which is coupled, for control purposes, to a charging circuit for the second transistor in order to start the charging thereof with a further delay.

6. An integrated circuit as claimed in claim 3, characterized in that a first one of the current branches comprises a main current channel of a first charging transistor, and that a second one of the current branches comprises a series connection of the main current channels of a second and a third charging transistor, a first one of the taps being coupled to respective control electrodes of the first and the second charging transistor in order to activate the current branches, a second one of the taps being coupled to a control electrode of the third charging transistor in order to deactivate the second current branch after the delay time.

7. An integrated circuit as claimed in claim 3, characterized in that the output is fed back to a control input of at least one of the current branches coupled to the control electrode of at least one of the output transistors for which the charging of its control electrode is started as the last one in the series in order to deactivate this current branch when a voltage difference between the output and the supply terminal is less than a predetermined threshold value.

8. An integrated circuit as claimed in claim 1, characterized in that a width-to-length ratio of one of the output transistors, for which the charging of its control electrode is started first, is smaller than the W/L ratio of a further output transistor for which the charging of its control electrode is started later.

9. An integrated circuit as claimed in claim 1, characterized in that the control circuit comprises discharge switches, connected between the supply terminal and the respective control electrodes of the output transistors, the control circuit being arranged for terminating the charging and to close the discharge switches together in response to a further variation which opposes said variation of the input signal.

10. An integrated circuit, comprising an output transistor, a main current channel of which is connected between a supply terminal and an output, an input of the circuit being coupled to delay means, comprising taps for mutually delayed output signals which are coupled to respective current branches for the purpose of control to activate the current branches simultaneously and to deactivate a sub-set of the current branches after a delay time, the current branches being coupled, parallel to one another, between a second supply terminal and control electrode of the output transistor such that all signals to said control electrode are derived from said delay means.

* * * * *